United States Patent
Lim et al.

(10) Patent No.: US 11,211,356 B2
(45) Date of Patent: Dec. 28, 2021

(54) POWER SEMICONDUCTOR PACKAGE AND METHOD FOR FABRICATING A POWER SEMICONDUCTOR PACKAGE

(71) Applicant: Infineon Technologies AG, Neubiberg (DE)

(72) Inventors: Wee Aun Jason Lim, Melaka (MY); Paul Armand Asentista Calo, Melaka (MY); Ting Soon Chin, Malacca (MY); Chooi Mei Chong, Melaka (MY); Sanjay Kumar Murugan, Malacca (MY); Ying Pok Sam, Melaka (MY); Chee Voon Tan, Seremban (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/991,123

(22) Filed: Aug. 12, 2020

(65) Prior Publication Data
US 2021/0057375 A1   Feb. 25, 2021

(30) Foreign Application Priority Data
Aug. 20, 2019   (DE) .......................... 102019122382.2

(51) Int. Cl.
*H01L 23/495* (2006.01)
*H01L 23/28* (2006.01)
(Continued)

(52) U.S. Cl.
CPC ............ *H01L 24/84* (2013.01); *H01L 21/565* (2013.01); *H01L 23/3107* (2013.01); *H01L 23/3135* (2013.01); *H01L 23/495* (2013.01); *H01L 23/49503* (2013.01); *H01L 23/49541* (2013.01); *H01L 23/49551* (2013.01); *H01L 23/49838* (2013.01); *H01L 24/29* (2013.01); *H01L 24/30* (2013.01); *H01L 24/32* (2013.01);
(Continued)

(58) Field of Classification Search
CPC ......... H01L 24/33; H01L 24/41; H01L 24/38; H01L 24/84; H01L 24/40; H01L 24/32; H01L 24/29; H01L 24/30; H01L 24/83; H01L 24/37; H01L 23/49838; H01L 23/49551; H01L 23/3135; H01L 23/495; H01L 23/3107; H01L 23/49503; H01L 23/49541; H01L 21/565; H01L 2924/181; H01L 2924/12032
See application file for complete search history.

(56) References Cited

U.S. PATENT DOCUMENTS 6,265,771 B1   6/2001   Ference et al.
10,535,587 B2 *  1/2020   Privitera ................ H01L 23/34
(Continued)

*Primary Examiner* — Alonzo Chambliss
(74) *Attorney, Agent, or Firm* — Murphy, Bilak & Homiller, PLLC

(57) ABSTRACT

A power semiconductor package includes a power semiconductor chip, an electrical connector arranged at a first side of the power semiconductor chip and having a first surface that is coupled to a power electrode of the power semiconductor chip, an encapsulation body at least partially encapsulating the power semiconductor chip and the electrical connector, and an electrical insulation layer arranged at a second surface of the electrical connector opposite the first surface, wherein parts of the encapsulation body and the electrical insulation layer form a coplanar surface of the power semiconductor package.

17 Claims, 7 Drawing Sheets

(51) Int. Cl.
*H01L 21/00* (2006.01)
*H05K 7/18* (2006.01)
*H01L 23/00* (2006.01)
*H01L 21/56* (2006.01)
*H01L 23/31* (2006.01)
*H01L 23/498* (2006.01)

(52) U.S. Cl.
CPC .............. *H01L 24/38* (2013.01); *H01L 24/40* (2013.01); *H01L 24/83* (2013.01); *H01L 2224/40175* (2013.01); *H01L 2224/8484* (2013.01); *H01L 2224/8492* (2013.01); *H01L 2224/84801* (2013.01)

(56) References Cited

U.S. PATENT DOCUMENTS

| | | | |
|---|---|---|---|
| 2008/0246130 A1* | 10/2008 | Carney | H01L 23/49568 257/675 |
| 2013/0256856 A1* | 10/2013 | Mahler | H01L 24/84 257/676 |
| 2015/0214189 A1* | 7/2015 | Tan | H01L 23/3121 257/773 |
| 2017/0200705 A1 | 7/2017 | Zhang et al. | |
| 2018/0331087 A1 | 11/2018 | Lee et al. | |

* cited by examiner

POWER SEMICONDUCTOR PACKAGE AND METHOD FOR FABRICATING A POWER SEMICONDUCTOR PACKAGE

TECHNICAL FIELD

This disclosure relates in general to a power semiconductor package and to a method for fabricating a power semiconductor package.

BACKGROUND

Semiconductor device manufacturers constantly strive to improve the manufacturing techniques of semiconductor packages as well as the electrical, thermal and mechanical properties of semiconductor packages. Many manufacturing techniques for power semiconductor packages require removing material from an intermediate product, e.g. by ablation, etching, grinding, sawing etc. Such removal processes may be time consuming or resource intensive and may therefore increase fabrication costs of power semiconductor packages. Improved methods for fabricating a power semiconductor package and improved power semiconductor packages may help to overcome these and other problems.

The problem on which the invention is based is solved by the features of the independent claims. Further advantageous examples are described in the dependent claims.

SUMMARY

Various aspects pertain to a power semiconductor package, comprising: a power semiconductor chip, an electrical connector arranged at a first side of the power semiconductor chip and comprising a first surface that is coupled to a power electrode of the power semiconductor chip, an encapsulation body at least partially encapsulating the power semiconductor chip and the electrical connector, and an electrical insulation layer arranged at a second surface of the electrical connector opposite the first surface, wherein parts of the encapsulation body and the electrical insulation layer form a coplanar surface of the power semiconductor package.

Various aspects pertain to a method for fabricating a power semiconductor package, the method comprising: providing a power semiconductor chip, arranging an electrical connector at a first side of the power semiconductor chip and coupling a first surface of the electrical connector to a power electrode on the first side of the power semiconductor chip, arranging an electrical insulation layer at a second surface of the electrical connector, opposite the first surface, encapsulating the power semiconductor chip and the electrical connector at least partially with an encapsulation body, and thinning the encapsulation body and the electrical insulation layer such that after the thinning parts of the encapsulation body and the electrical insulation layer form a coplanar surface of the power semiconductor package.

Various aspects pertain to a method for fabricating a power semiconductor package, the method comprising: providing a power semiconductor chip, arranging an electrical connector over the power semiconductor chip and coupling a first surface of the electrical connector to a power electrode of the power semiconductor chip, encapsulating the power semiconductor chip and the electrical connector at least partially with an encapsulation body such that a second surface of the electrical connector, opposite the first surface, is at least partially exposed, and arranging an electrical insulation layer over the exposed part of the electrical connector such that parts of the encapsulation body and the electrical insulation layer form a coplanar surface of the power semiconductor package.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Like reference numerals designate corresponding similar parts.

DETAILED DESCRIPTION

In the following, directional terminology, such as "top", "bottom", "left", "right", "upper", "lower" etc., may be used with reference to the orientation of the Figure(s) being described. Because components of the disclosure can be positioned in a number of different orientations, the directional terminology is used for purposes of illustration and is in no way limiting.

In addition, while a particular feature or aspect of an example may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other.

The semiconductor chip(s) described further below may be of different types, may be manufactured by different technologies and may e.g. comprise AC/DC or DC/DC converter circuits, power MOS transistors, power Schottky diodes, JFETs (Junction Gate Field Effect Transistors), power bipolar transistors, logic integrated circuits, power integrated circuits, chips with integrated passives, etc. The examples may also use semiconductor chips comprising transistor structures in which at least one electrical contact pad is arranged on a first side of the semiconductor chip and at least one other electrical contact pad is arranged on a second side of the semiconductor chip opposite to the first side.

The semiconductor chips can be manufactured from specific semiconductor material, for example Si, SiC, SiGe, GaAs, GaN, or from any other semiconductor material.

Figure 1:
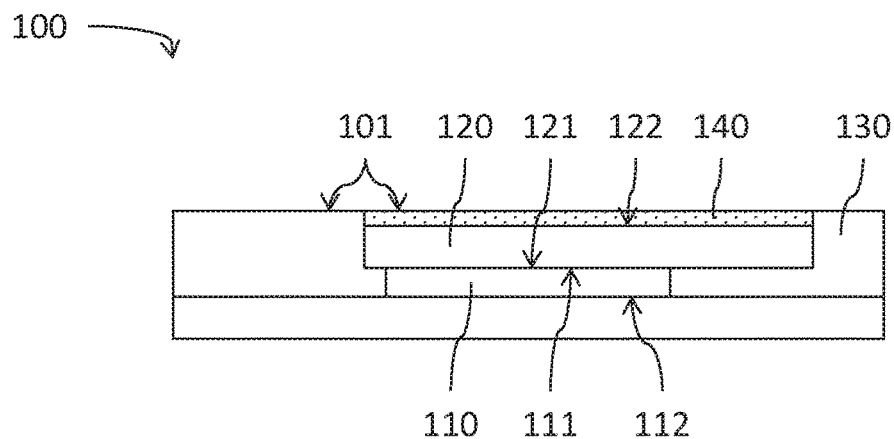
FIG. 1 shows a side view of a power semiconductor package, wherein parts of an encapsulation body and an electrical insulation layer form a coplanar surface.

FIG. 1 shows a power semiconductor package 100 comprising a power semiconductor chip 110, an electrical connector 120, an encapsulation body 130 and an electrical insulation layer 140. The electrical connector 120 is arranged at a first side 111 of the power semiconductor chip 110 and comprises a first surface 121 that is electrically coupled to a power electrode of the power semiconductor chip 110. The encapsulation body 130 at least partially encapsulates the power semiconductor chip 110 and the electrical connector 120. The electrical insulation layer 140 is arranged at a second surface 122 of the electrical connector 120 opposite the first surface 121 such that parts of the encapsulation body 130 and the electrical insulation layer 140 form a coplanar surface 101 of the power semiconductor package 100.

The power semiconductor chip 110 may be arranged on a carrier, e.g. on a die pad, such that a second side 112 of the power semiconductor chip 110 opposite the first side 111 faces the carrier. The carrier may be at least partially exposed from the encapsulation body 130, e.g. on a side of the power semiconductor package 100 that is opposite to the coplanar surface 101. The power semiconductor chip 110 may comprise a further power electrode arranged on the second side 112 and electrically coupled to the carrier.

The electrical connector 120 may be configured to electrically couple a power electrode of the power semiconductor chip 110 to another part of the power semiconductor package 100, e.g. to an external contact or to another power semiconductor chip. The electrical connector 120 may be coupled to the power electrode e.g. by a solder joint or sintered joint. The electrical connector 120 may comprise or consist of a metal like Al, Cu or Fe or it may comprise or consist of a metal alloy. The second surface 122 of the electrical connector 120 may essentially be flat. According to an example, the electrical connector 120 may be a contact clip.

The encapsulation body 130 may comprise or consist of an electrically insulating material, e.g. a polymer. According to an example, the encapsulation body 130 is a molded body. The molded body may for example be fabricated by injection molding. According to an example, the encapsulation body 130 may partially encapsulate the electrical insulation layer 140.

The encapsulation body 130, in particular at the coplanar surface 101, may comprise traces of a grinding process that was performed on the encapsulation body 130 during fabrication of the power semiconductor package 100. For example, the encapsulation body 130 may have a greater surface roughness on the coplanar surface 101 compared to other surfaces. As another example, the encapsulation body 130 may comprise scratches on the coplanar surface 101 that stem from the grinding process but it may comprise no such scratches on other surfaces (that were not subjected to grinding). Furthermore, the encapsulation body 130, in particular at the coplanar surface 101, may be contaminated with grinding particles of the electrical insulation layer material.

The electrical insulation layer 140 may comprise or consist of any suitable electrically insulating material, for example silicone. The electrical insulation layer 140 may for example comprise or consist of thermal interface material (TIM). The electrical insulation layer 140 may comprise or consist of a material or material composition that is different from the material or material composition of the encapsulation body 130.

The electrical insulation layer 140 may be configured to insulate the electrical connector 120 from e.g. a heatsink that may be arranged at the coplanar surface 101. The electrical insulation layer 140 may cover the complete second surface 122 of the electrical connector 120 as shown in FIG. 1. Alternatively, the electrical insulation layer 140 may cover only a part of the second surface 122 and the remaining part may be covered by the encapsulation body 130.

The electrical insulation layer 140 may have any suitable thickness, for example a thickness in the range of 20 µm to 100 µm, e.g. about 50 µm.

The electrical insulation layer 140 may be arranged directly on the second surface 122 of the electrical connector 120. However, according to an example it is also possible that an intermediary element is arranged between the electrical connector 120 and the electrical insulation layer 140. Such an intermediary element may for example comprise or consist of a passivation layer.

The electrical insulation layer 140 may comprise traces of a grinding process, similar to the encapsulation body 130 as mentioned further above. Such traces may e.g. comprise scratches or a contamination with grinding particles of encapsulation body material.

The electrical insulation layer 140 and the encapsulation body 130 may directly abut one another. In particular, there may be no gap between the electrical insulation layer 140 and the encapsulation body 130 on the coplanar surface 101.

Figure 2A:
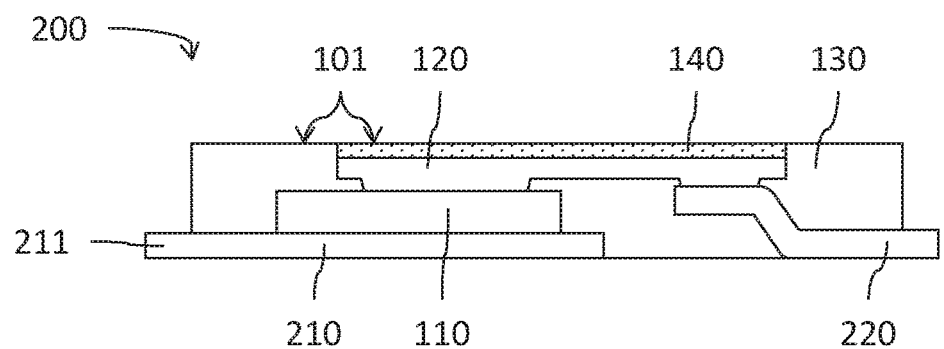
FIGS. 2A and 2B show a side view and a top view of a further power semiconductor package, wherein parts of an encapsulation body and an electrical insulation layer form a coplanar surface.

FIG. 2A shows a further power semiconductor package 200 which may be similar or identical to the power semiconductor package 100, except for the differences mentioned in the following.

The power semiconductor package 200 comprises a carrier 210 and a first external contact 220. The power semiconductor chip 110 is arranged on the carrier 210 and is electrically coupled to it. The first external contact 220 is arranged laterally besides the carrier 210 and the electrical connector 120 electrically couples the power semiconductor chip 110 to the first external contact 220.

According to an example, the electrical connector 120 and the first external contact 220 are two different parts (this case is shown in FIG. 2A). The two parts may e.g. be connected by a solder joint or they may be sintered onto one another. According to another example, the electrical connector 120 and the first external contact 220 are a common part, meaning that the electrical connector 120 comprises a distal end that extends out of the encapsulation body 130 and forms the first external contact 220.

The power semiconductor package 200 may further comprise a second external contact 211. The second external contact 211 may e.g. be part of the carrier 210. The first and second external contacts 220, 211 may essentially be coplanar and may e.g. be arranged at opposing sides of the power semiconductor package 200. Furthermore, the external contacts 220, 211 may extend beyond a contour of the encapsulation body 130 (as shown in FIG. 2A). However, it is also possible that the external contacts 220, 211 do not extend beyond the contour of the encapsulation body 130 (in this case the power semiconductor package 200 may be termed a leadless package).

According to an example, the carrier 210 and/or the first external contact 220 are parts of a leadframe. According to another example, the carrier 210 is a carrier of the type direct aluminum bond (DAB), direct copper bond (DCB), active metal brazing, etc.

Figure 2B:
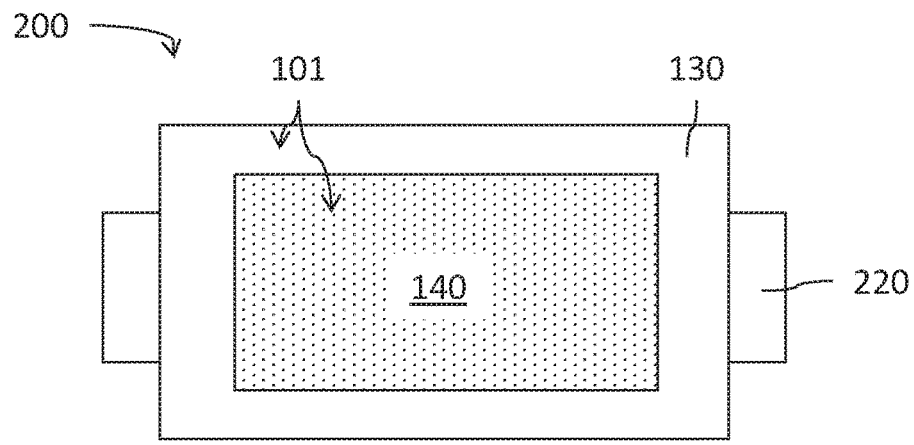

FIG. 2B shows a top down view onto the coplanar surface 101 of power semiconductor package 200. The electrical insulation layer 140 may be arranged at any suitable position of the coplanar surface 101, e.g. in the middle as shown in FIG. 2B. The electrical insulation layer 140 may be surrounded on all four sides by the encapsulation body 130 or it may extend to one or more edges of the power semiconductor package 200.

Any suitable percentage of the coplanar surface 101 may be comprised of the electrical insulation layer 140, for example more than 20%, more than 40%, more than 60%, or more than 80%. According to an example, it is also possible that almost all or even the entire coplanar surface 101 is comprised of the electrical insulation layer 140.

According to an example, the power semiconductor package 200 comprises more than one electrical insulation layers 140. These more than one electrical insulation layers 140 may e.g. be arranged side by side on the coplanar surface 101. For example, the power semiconductor package 200 may comprise more than one power semiconductor chips 110 and electrical connectors 120 and each electrical insulation layer 140 may be arranged on one of these electrical connectors 120.

In the following FIGS. 3A to 3H the power semiconductor package 200 is shown in various stages of fabrication according to an example of a method for fabricating a power semiconductor package. The power semiconductor package 100 may for example be fabricated in a similar manner.

Figure 3A:
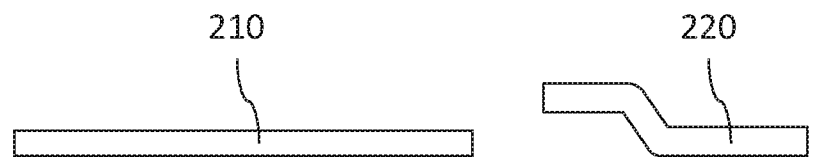
FIGS. 3A to 3H show side views of a power semiconductor package in various stages of fabrication according to a method of fabrication.

As shown in FIG. 3A, the carrier 210 and the first external contact may be provided. The carrier 210 and/or the first external contact 220 may be part of a leadframe. According to an example, the carrier 210 and/or the first external contact 220 are provided while they are still part of a leadframe strip. The carrier 210 and/or the first external contact 220 may be arranged on a temporary carrier, e.g. an adhesive tape.

Figure 3B:
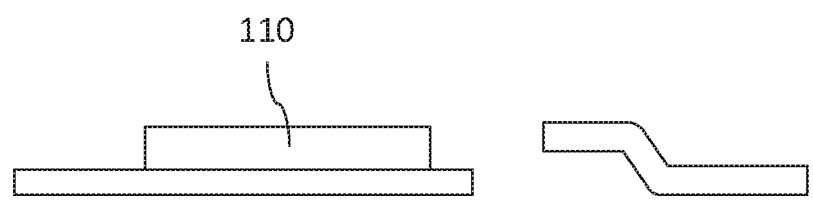

As shown in FIG. 3B, the power semiconductor chip 110 may be arranged on the carrier 210. This may comprise using a pick-and-place process. Arranging the power semiconductor chip 110 on the carrier 210 may further comprise electrically and mechanically coupling the power semiconductor chip 110 to the carrier 210. This may e.g. be done by soldering or sintering.

Figure 3C:
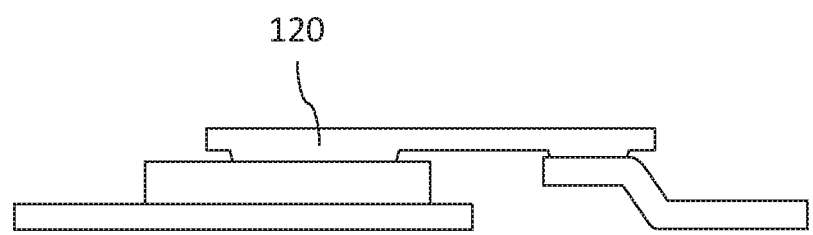

As shown in FIG. 3C, the electrical connector 120 may be arranged on the power semiconductor chip 110. The electrical connector 120 may further be arranged on the first external contact 220. Arranging the electrical connector 120 on the power semiconductor chip 110 and possibly also on the first external contact 220 may comprise using a pick-and-place process. The electrical connector 120 may furthermore be electrically and mechanically coupled to the power semiconductor chip 110 and possibly also to the first external contact 220 by e.g. soldering or sintering.

According to an example, the electrical connector 120 is soldered or sintered onto the power semiconductor chip 110 (and the first external contact 220) after the power semiconductor chip has already been soldered or sintered onto the carrier 210. According to another example, all joints are soldered or sintered simultaneously.

Figure 3D:
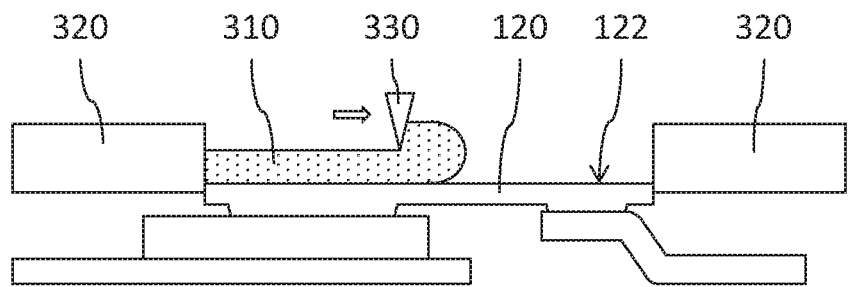

As shown in FIG. 3D, electrically insulating material 310 is deposited on the electrical connector 120, in particular on the second surface 122. The electrically insulating material 310 may e.g. be dispensed on the electrical connector 120 in fluid form. Furthermore, a stencil 320 and/or a squeegee 330 may be used to distribute the electrically insulating material 310 on the second surface 122 of the electrical connector 120 in a predefined manner.

Figure 3E:
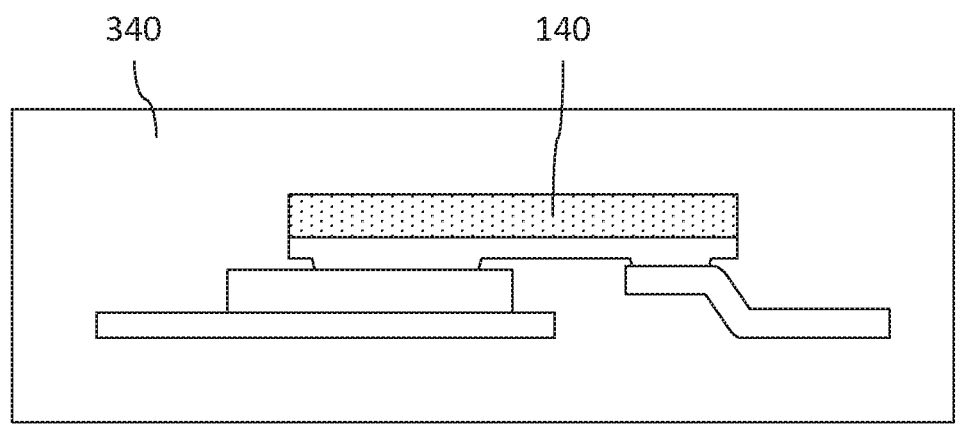

As shown in FIG. 3E, a curing process may be used to cure the electrically insulating material 310. For example, the electrically insulating material 310 may comprise a fluxing agent and the curing process may be used to remove the fluxing agent. The electrically insulating material 310 may e.g. be cured by applying heat in an oven 340. Curing in the oven 340 may be done using any suitable curing temperature, e.g. a curing temperature of no more than about 250° C., no more than about 200° C., or no more than about 150° C. The curing process may e.g. last for no more than several minutes, no more than two minutes, no more than one minute or no more than 30 s.

The curing process may cause the formation of the (potentially hardened) electrical insulation layer 140.

Figure 3F:
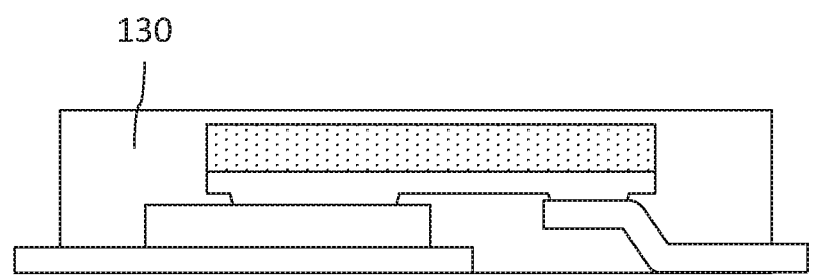

As shown in FIG. 3F, the encapsulation body 130 may be fabricated. This may in particular be done after the electrically insulating material 310 has been cured and the electrical insulation layer 140 has been formed.

Fabricating the encapsulation body 130 may comprise molding over the carrier 210, the first external contact 220, the power semiconductor chip 110 and the electrical connector 120. Fabricating the encapsulation body 130 may further comprise molding over the electrical insulation layer 140. Molding may be done using a suitable molding tool to obtain the encapsulation body 130.

According to an example, molding may be done such that the encapsulation body 130 completely covers the electrical insulation layer 140 (in particular, such that the encapsulation body 130 also covers the surface of the electrical insulation layer 140 that faces away from the electrical connector 120, compare FIG. 3F). According to another example, molding is done such that the encapsulation body 130 does not cover the surface of the electrical insulation layer 140 that faces away from the electrical connector 120.

According to an example, a further curing process may be used to cure the encapsulation body 130.

Figure 3G:
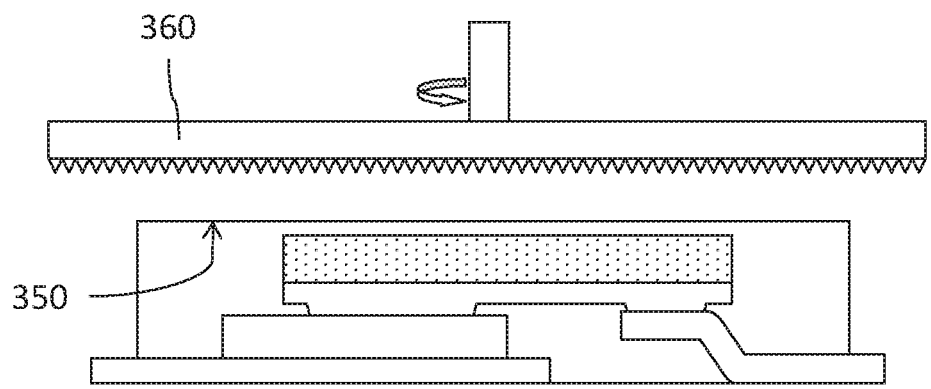

As shown in FIG. 3G, a grinding process may be used to grind a first side 350 of the power semiconductor package. Grinding may for example be done using a grinding wheel 360. The electrical insulation layer 140 may be exposed from the encapsulation body 130 by the grinding process.

According to an example, the electrical insulation layer 140 may have a thickness of 80 µm or more, 100 µm or more, or 120 µm or more prior to the grinding process. After the grinding process the electrical insulation layer 140 may e.g. have a thickness of 30 µm or more, 40 µm or more, or 50 µm or more.

The grinding process as shown in FIG. 3G advantageously does not require a grinding of the electrical connector 120. The electrical connector 120 may for example comprise or consist of a metal or metal alloy and may therefore be more robust than the electrical insulation layer 140. Grinding the electrical connector 120 would therefore increase the wear and tear of the grinding wheel 360. This in turn would increase the fabrication costs of the power semiconductor module.

Figure 3H:
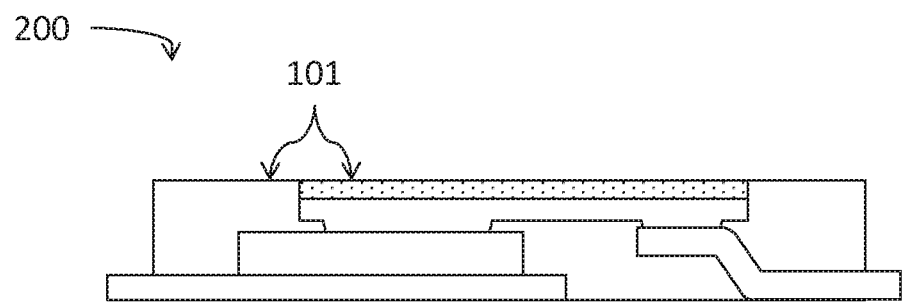

FIG. 3H shows the power semiconductor module 200 after the grinding process of FIG. 3G. Due to grinding the first side 350 of the power semiconductor package 200, the electrical insulation layer 140 and the encapsulation body 130 form the coplanar surface 101.

Figure 4:
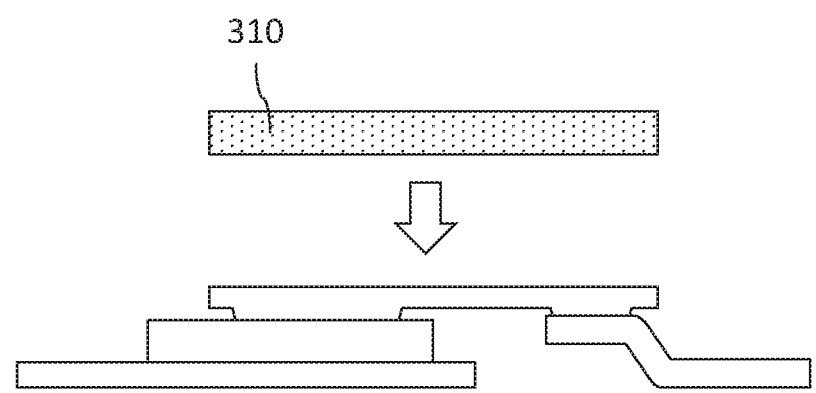
FIG. 4 shows a side view of a power semiconductor package in a stage of fabrication, wherein an electrical insulation layer is applied as a preform.

Depositing the electrically insulating material 310 as shown in FIG. 3D may comprise a dispensing process. However, other methods of depositing the electrically insulating material 310 are possible. FIG. 4 shows another deposition method that comprises arranging the electrically insulating material 310 in the form of a preform, that is a solid or semi-solid block on the electrical connector 120. Afterwards, the power semiconductor package may be processed as described with respect to FIGS. 3E to 3H.

Figure 5A:
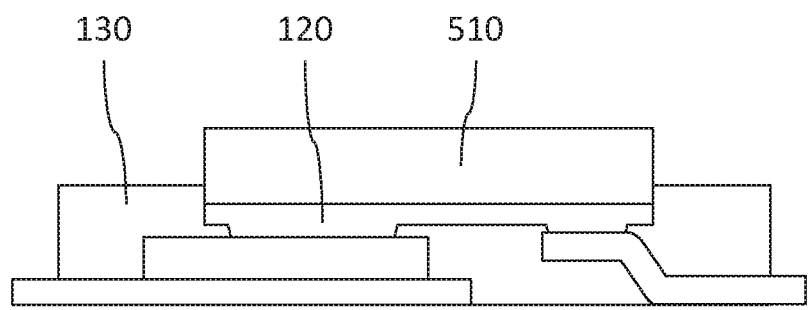
FIGS. 5A and 5B show side views of a power semiconductor package in different stages of fabrication according to a further method of fabrication.
Figure 5B:
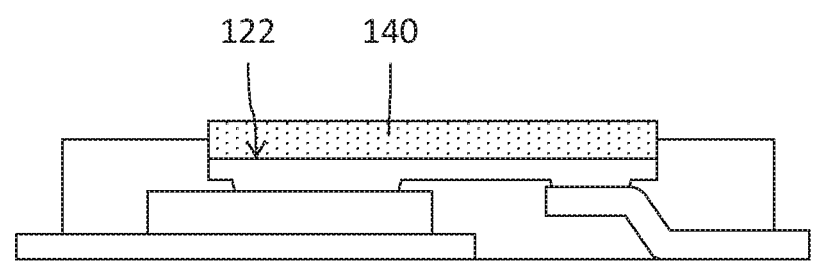

FIGS. 5A and 5B show a further method of fabricating a power semiconductor package, that may be used instead of the processes shown with respect to FIGS. 3D to 3F.

In FIGS. 3D to 3F it is shown that the electrical insulation layer 140 is fabricated prior to fabricating the encapsulation body 130. The method according to FIGS. 5A and 5B comprises fabricating the encapsulation body 130 prior to fabricating the electrical insulation layer 140.

FIG. 5A shows a molding process wherein the molding tool comprises a cover 510 that covers the second surface 122 of the electrical connector 120. After the molding process the second surfaces 122 is therefore exposed from the encapsulation body 130.

FIG. 5B shows arranging the electrical insulation layer 140 over the exposed second surface 122 of the electrical connector 120. Since the method according to FIGS. 5A and 5B does not necessarily comprise grinding the first side 350 of the power semiconductor package, the electrical insulation layer 140 and the encapsulation body 130 do not necessarily form a coplanar surface.

Figure 6:
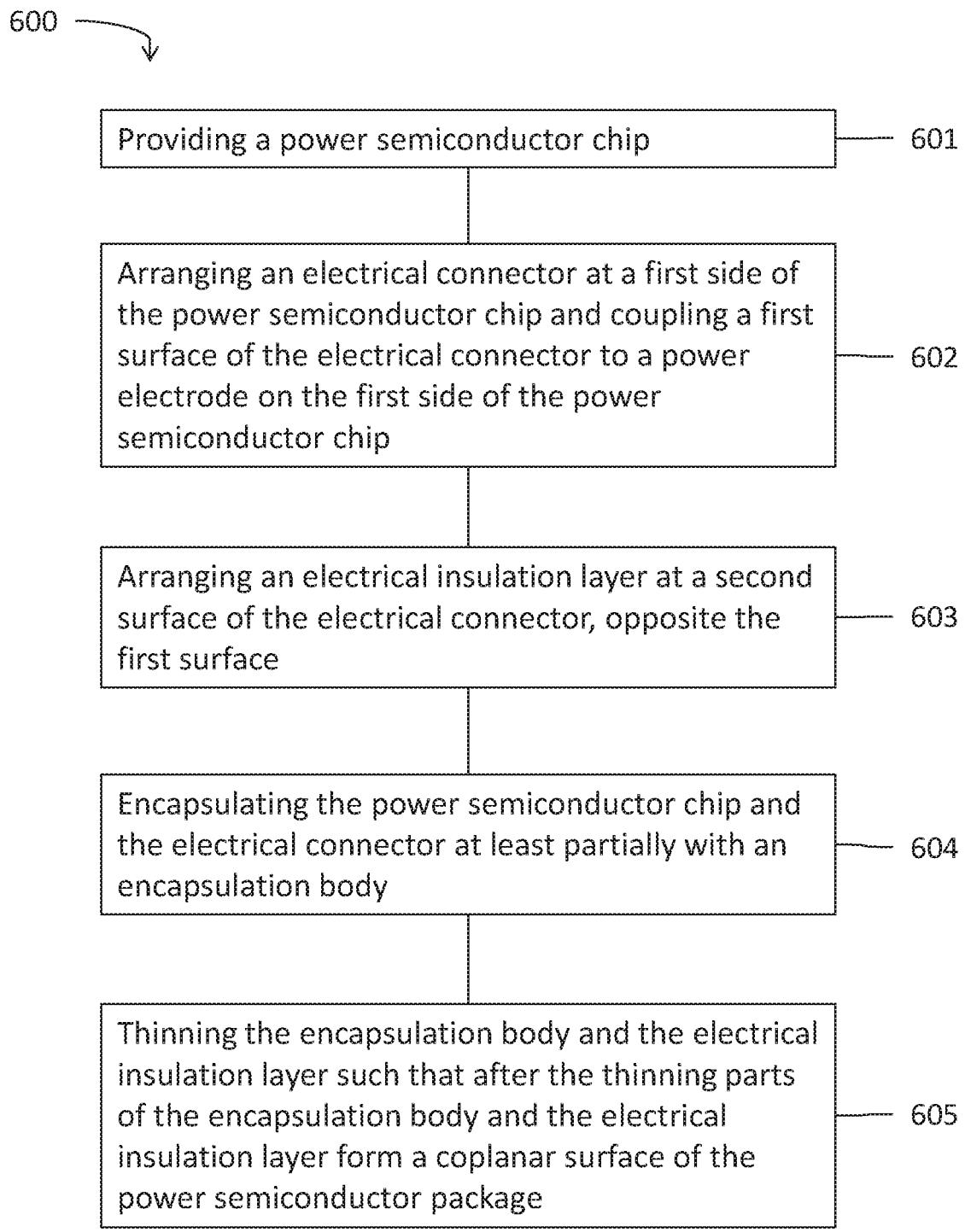
FIG. 6 shows a flow chart of a method for fabricating a power semiconductor package that comprises thinning the encapsulation body and the electrical insulation layer.

FIG. 6 is a flow chart of a method 600 for fabricating a power semiconductor package. The method 600 may for example be used to fabricate the power semiconductor packages 100 and 200.

The method 600 comprises at 601 providing a power semiconductor chip, at 602 arranging an electrical connector at a first side of the power semiconductor chip and coupling a first surface of the electrical connector to a power electrode on the first side of the power semiconductor chip, at 603 arranging an electrical insulation layer at a second surface of the electrical connector, opposite the first surface, at 604 encapsulating the power semiconductor chip and the electrical connector at least partially with an encapsulation body and at 605 thinning the encapsulation body and the electrical insulation layer such that after the thinning parts of the encapsulation body and the electrical insulation layer form a coplanar surface of the power semiconductor package.

According to an example of the method 600, the thinning may comprise one of a grinding, an etching, a sawing or an ablation process or a combination thereof. Furthermore, the electrical insulation layer may be arranged at the second surface of the electrical connector using a printing process or by depositing a preform. Furthermore, the encapsulating may comprise a molding process.

The method 600 may optionally comprise curing the electrical insulation layer prior to encapsulating with the encapsulation body. The method 600 may also optionally comprise arranging a heatsink at the coplanar surface after the thinning.

Figure 7:
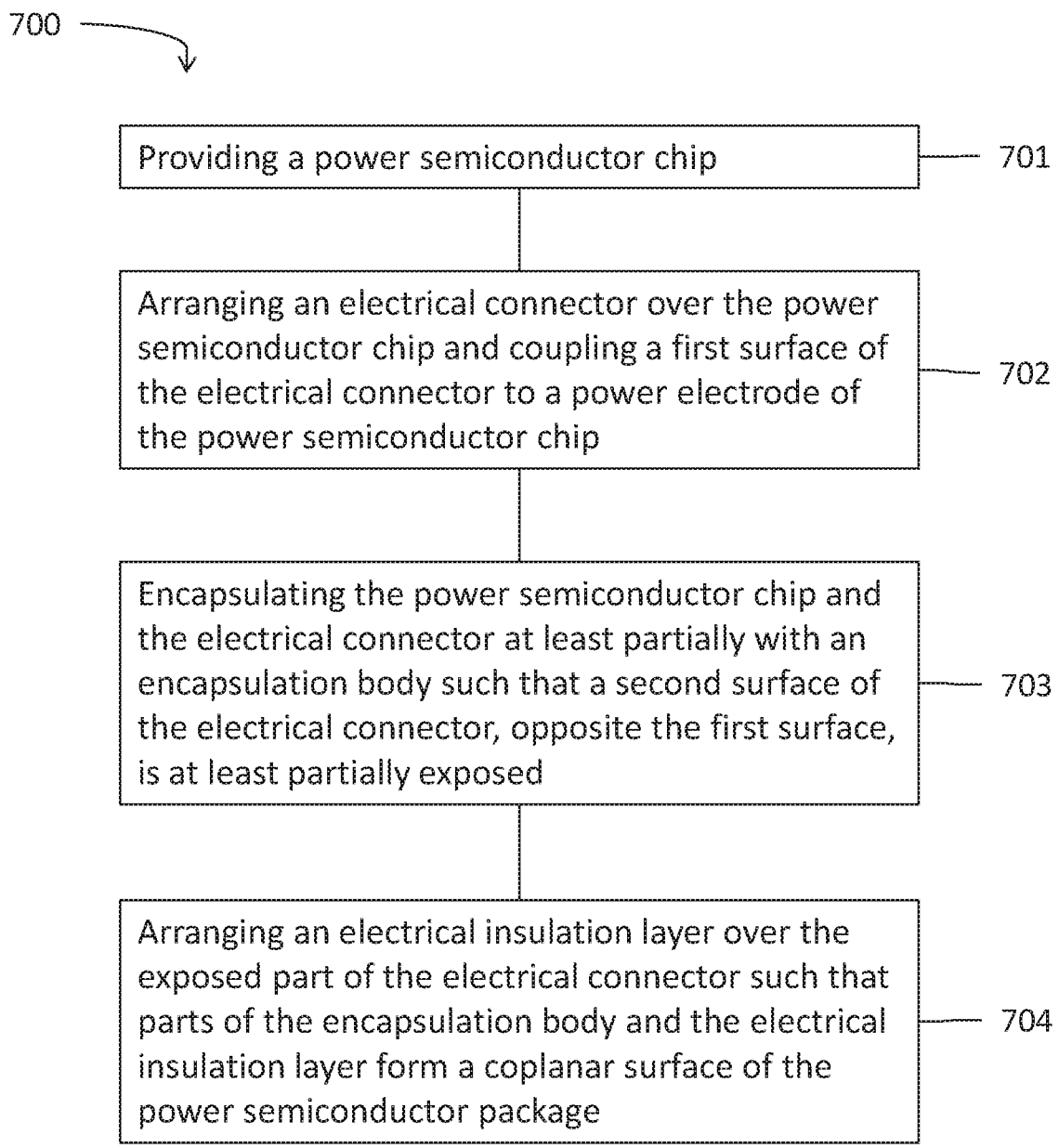
FIG. 7 shows a flow chart of a further method for fabricating a power semiconductor package.

FIG. 7 is a flow chart of a method 700 for fabricating a power semiconductor package. The method 700 may for example be used to fabricate the power semiconductor packages 100 and 200.

The method 700 comprises at 701 providing a power semiconductor chip, at 702 arranging an electrical connector over the power semiconductor chip and coupling a first surface of the electrical connector to a power electrode of the power semiconductor chip, at 703 encapsulating the power semiconductor chip and the electrical connector at least partially with an encapsulation body such that a second surface of the electrical connector, opposite the first surface, is at least partially exposed and at 704 arranging an electrical insulation layer over the exposed part of the electrical connector such that parts of the encapsulation body and the electrical insulation layer form a coplanar surface of the power semiconductor package.

According to an example of the method 700, the electrical insulation layer is arranged over the exposed part of the electrical connector using a printing process or by depositing a preform.

Examples

In the following the power semiconductor package and the method for fabricating a power semiconductor package are further described using particular examples.

Example 1 is a power semiconductor package, comprising: a power semiconductor chip, an electrical connector arranged at a first side of the power semiconductor chip and comprising a first surface that is coupled to a power electrode of the power semiconductor chip, an encapsulation body at least partially encapsulating the power semiconductor chip and the electrical connector, and an electrical insulation layer arranged at a second surface of the electrical connector opposite the first surface, wherein parts of the encapsulation body and the electrical insulation layer form a coplanar surface of the power semiconductor package.

Example 2 is the power semiconductor package of example 1, wherein the encapsulation body and the electrical insulation layer comprise grinding traces at the coplanar surface of the semiconductor package.

Example 3 is the power semiconductor package of examples 1 or 2, wherein the electrical insulation layer comprises a thermal interface material and wherein the coplanar surface is configured to be coupled to a heatsink.

Example 4 is the power semiconductor package of one of the preceding examples, further comprising: a die carrier, wherein the power semiconductor chip is arranged on the die carrier and wherein the die carrier is exposed from the encapsulation body at a side of the power semiconductor package opposite to the coplanar surface.

Example 5 is the power semiconductor package of one of the preceding examples, wherein the parts of the encapsulation body of the coplanar surface are contaminated with grinding particles of the insulation layer material and/or wherein the insulation layer is contaminated with grinding particles of encapsulation body material.

Example 6 is the power semiconductor package of one of the preceding examples, wherein the electrical connector comprises a metal clip.

Example 7 is a method for fabricating a power semiconductor package, the method comprising: providing a power semiconductor chip, arranging an electrical connector at a first side of the power semiconductor chip and coupling a first surface of the electrical connector to a power electrode on the first side of the power semiconductor chip, arranging an electrical insulation layer at a second surface of the electrical connector, opposite the first surface, encapsulating the power semiconductor chip and the electrical connector at least partially with an encapsulation body, and thinning the encapsulation body and the electrical insulation layer such that after the thinning parts of the encapsulation body and the electrical insulation layer form a coplanar surface of the power semiconductor package.

Example 8 is the method of example 7, wherein the thinning comprises one of a grinding, etching, sawing and ablation process or a combination thereof.

Example 9 is the method of example 7 or 8, wherein the electrical insulation layer is arranged at the second surface of the electrical connector using a printing process or by depositing a preform.

Example 10 is the method of one of examples 7 to 9, further comprising: curing the electrical insulation layer prior to encapsulating with the encapsulation body.

Example 11 is the method of one of examples 7 to 10, wherein the encapsulating comprises a molding process.

Example 12 is the method of one of examples 7 to 11, further comprising: after the thinning arranging a heatsink at the coplanar surface.

Example 13 is a method for fabricating a power semiconductor package, the method comprising: providing a power semiconductor chip, arranging an electrical connector over the power semiconductor chip and coupling a first surface of the electrical connector to a power electrode of the power semiconductor chip, encapsulating the power semiconductor chip and the electrical connector at least partially with an encapsulation body such that a second surface of the electrical connector, opposite the first surface, is at least partially exposed, and arranging an electrical insulation layer over the exposed part of the electrical connector such that parts of the encapsulation body and the electrical insulation layer form a coplanar surface of the power semiconductor package.

Example 14 is the method of example 13, wherein the electrical insulation layer is arranged over the exposed part of the electrical connector using a printing process or by depositing a preform.

Example 15 is the method of example 13 or 14, wherein the encapsulating comprises a molding process.

Example 16 is the method of one of examples 13 to 15, further comprising: curing the electrical insulation layer.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A power semiconductor package, comprising:
   a power semiconductor chip;
   an electrical connector arranged at a first side of the power semiconductor chip and comprising a first surface that is coupled to a power electrode of the power semiconductor chip;
   an encapsulation body at least partially encapsulating the power semiconductor chip and the electrical connector; and
   an electrical insulation layer arranged at a second surface of the electrical connector opposite the first surface,
   wherein parts of the encapsulation body and the electrical insulation layer form a coplanar surface of the power semiconductor package.

2. The power semiconductor package of claim 1, wherein the encapsulation body and the electrical insulation layer comprise grinding traces at the coplanar surface of the semiconductor package.

3. The power semiconductor package of claim 1, wherein the electrical insulation layer comprises a thermal interface material, and wherein the coplanar surface is configured to be coupled to a heatsink.

4. The power semiconductor package of claim 1, further comprising:
   a die carrier,
   wherein the power semiconductor chip is arranged on the die carrier, and
   wherein the die carrier is exposed from the encapsulation body at a side of the power semiconductor package opposite to the coplanar surface.

5. The power semiconductor package of claim 1, wherein the parts of the encapsulation body of the coplanar surface are contaminated with grinding particles of the insulation layer material.

6. The power semiconductor package of claim 1, wherein the insulation layer is contaminated with grinding particles of encapsulation body material.

7. The power semiconductor package of claim 1, wherein the electrical connector comprises a metal clip.

8. A method for fabricating a power semiconductor package, the method comprising:
   providing a power semiconductor chip;
   arranging an electrical connector at a first side of the power semiconductor chip and coupling a first surface of the electrical connector to a power electrode on the first side of the power semiconductor chip;
   arranging an electrical insulation layer at a second surface of the electrical connector opposite the first surface;
   encapsulating the power semiconductor chip and the electrical connector at least partially with an encapsulation body; and
   thinning the encapsulation body and the electrical insulation layer such that after the thinning parts of the encapsulation body and the electrical insulation layer form a coplanar surface of the power semiconductor package.

9. The method of claim 8, wherein the thinning comprises one of a grinding, etching, sawing and ablation process or a combination thereof.

10. The method of claim 8, wherein the electrical insulation layer is arranged at the second surface of the electrical connector using a printing process or by depositing a preform.

11. The method of claim 8, further comprising:
    curing the electrical insulation layer prior to encapsulating with the encapsulation body.

12. The method of claim 8, wherein the encapsulating comprises a molding process.

13. The method of claim 8, further comprising:
    after the thinning, arranging a heatsink at the coplanar surface.

14. A method for fabricating a power semiconductor package, the method comprising:
    providing a power semiconductor chip;

arranging an electrical connector over the power semiconductor chip and coupling a first surface of the electrical connector to a power electrode of the power semiconductor chip;

encapsulating the power semiconductor chip and the electrical connector at least partially with an encapsulation body such that a second surface of the electrical connector, opposite the first surface, is at least partially exposed; and arranging an electrical insulation layer over the exposed part of the electrical connector such that parts of the encapsulation body and the electrical insulation layer form a coplanar surface of the power semiconductor package.

15. The method of claim 14, wherein the electrical insulation layer is arranged over the exposed part of the electrical connector using a printing process or by depositing a preform.

16. The method of claim 14, wherein the encapsulating comprises a molding process.

17. The method of claim 14, further comprising:
curing the electrical insulation layer.

\* \* \* \* \*